United States Patent
Inamura

(10) Patent No.: US 9,029,977 B2
(45) Date of Patent: May 12, 2015

(54) POWER CONVERSION APPARATUS

(71) Applicant: Denso Corporation, Kariya, Aichi-pref. (JP)

(72) Inventor: Hiroshi Inamura, Kariya (JP)

(73) Assignee: Denso Corporation, Kariya (JP)

( * ) Notice: Subject to any disclaimer, the term of this patent is extended or adjusted under 35 U.S.C. 154(b) by 143 days.

(21) Appl. No.: 13/845,779

(22) Filed: Mar. 18, 2013

(65) Prior Publication Data

US 2013/0285191 A1 Oct. 31, 2013

(30) Foreign Application Priority Data

Apr. 25, 2012 (JP) .................................. 2012-099691

(51) Int. Cl.
H01L 21/70 (2006.01)
H01L 27/02 (2006.01)
H02M 7/00 (2006.01)

(52) U.S. Cl.
CPC ............ *H01L 27/02* (2013.01); *H01L 27/0203* (2013.01); *H01L 27/0207* (2013.01); *H02M 7/003* (2013.01)

(58) Field of Classification Search
CPC .................. H01L 27/0203; H01L 27/0207
USPC .......................................... 257/499, E23.079
See application file for complete search history.

(56) References Cited

FOREIGN PATENT DOCUMENTS

JP 2002-325467 11/2002
JP 2009-213307 9/2009

OTHER PUBLICATIONS

Office Action (2 pgs.) dated Mar. 18, 2014 issued in corresponding Japanese Application No. 2012-099691 with an at least partial English-language translation (2 pgs.).

*Primary Examiner* — Amar Movva
(74) *Attorney, Agent, or Firm* — Nixon & Vanderhye P.C.

(57) ABSTRACT

The power conversion apparatus includes semiconductor modules and a circuit board on which a control circuit is formed. Each semiconductor module includes signal terminals electrically connected to the circuit board. The signal terminals of each semiconductor module are arranged in a line so as to form a terminal row along a first direction. The semiconductor modules are grouped into upper arm semiconductor modules and lower arm semiconductor modules each connected to a corresponding one of the upper arm semiconductor module. Upper arm terminal rows as the terminal rows of the upper arm semiconductor modules and lower arm terminal rows as the terminal rows of the lower arm semiconductor modules are arranged in a staggered manner along a second direction perpendicular to the first direction and to a third direction in which the signal terminals of the semiconductor modules project, the first, second and third directions being perpendicular to one another.

7 Claims, 7 Drawing Sheets

POWER CONVERSION APPARATUS

This application claims priority to Japanese Patent Application No. 2012-99691 filed on Apr. 25, 2012, the entire contents of which are hereby incorporated by reference.

BACKGROUND OF THE INVENTION

1. Field of the Invention

The present invention relates to a power conversion apparatus including semiconductor modules each incorporating a switching element and a circuit board on which a control circuit for controlling the semiconductor modules is formed.

2. Description of Related Art

Generally, a power conversion apparatus such as an inverter or a converter includes semiconductor modules and a circuit board on which a control circuit for controlling the semiconductor modules is formed. The circuit board on which various electronic components constituting the control circuit are mounted is connected with signal terminals of the semiconductor modules. The dimensions of the circuit board have to be sufficiently small for the power conversion apparatus to be compact in size. Japanese Patent Application Laid-open No. 2009-213307 describes a power conversion apparatus having the structure in which adjusting elements for adjusting the switching speeds of switching elements are mounted on both the front and back surfaces of a circuit board for the purpose of reducing the dimensions of the circuit board.

However, the above structure does not always make it possible to sufficiently reduce the dimensions of such a circuit board depending on the layout of the signal terminals.

In the power conversion apparatus described in the above patent document, each upper arm semiconductor module on the high potential side and the corresponding lower arm semiconductor module are aligned along the terminal arranging direction (the direction in which their signal terminals are arranged). Accordingly, to reduce the dimension in the terminal arranging direction of the circuit board, it is necessary to reduce the distance between the upper arm semiconductor module and the lower arm semiconductor modules as much as possible, and accordingly, it is necessary to reduce the distance between the upper arm terminal row (the row of the signal terminals of the upper arm semiconductor module) and the lower arm terminal row (the row of the terminals of the lower arm semiconductor module). However, in this case, it becomes difficult to provide a sufficient creepage distance between these rows.

In addition, since the space for forming connecting portions corresponding to the upper arm terminal row and the lower arm terminal row spreads out in the terminal arranging direction, the space for mounting other electronic components on the circuit board is restricted.

SUMMARY

An exemplary embodiment provides a power conversion apparatus including:

semiconductor modules constituting a power conversion circuit, each of the semiconductor modules incorporating a switching element; and a circuit board on which a control circuit for controlling switching of the switching elements of the semiconductor modules is formed, wherein each of the semiconductor modules includes signal terminals electrically connected to the circuit board, the signal terminals of each of the semiconductor modules are arranged in a line so as to form a terminal row along a first direction, the semiconductor modules are grouped into upper arm semiconductor modules each connected to a high potential side of the power conversion circuit and lower arm semiconductor modules each connected to a low potential side of the power conversion circuit and to a corresponding one of the upper arm semiconductor modules, and upper arm terminal rows as the terminal rows of the upper arm semiconductor modules and lower arm terminal rows as the terminal rows of the lower arm semiconductor modules are arranged in a staggered manner along a second direction perpendicular to the first direction and to a third direction in which the signal terminals of the semiconductor modules project, the first, second and third directions being perpendicular to one another.

According to the exemplary embodiment, there is provided a power conversion apparatus the circuit board of which can be made compact in size and provides a high degree of flexibility in layout of electronic components to be mounted thereon.

Other advantages and features of the invention will become apparent from the following description including the drawings and claims.

PREFERRED EMBODIMENTS OF THE INVENTION

Figure 1:
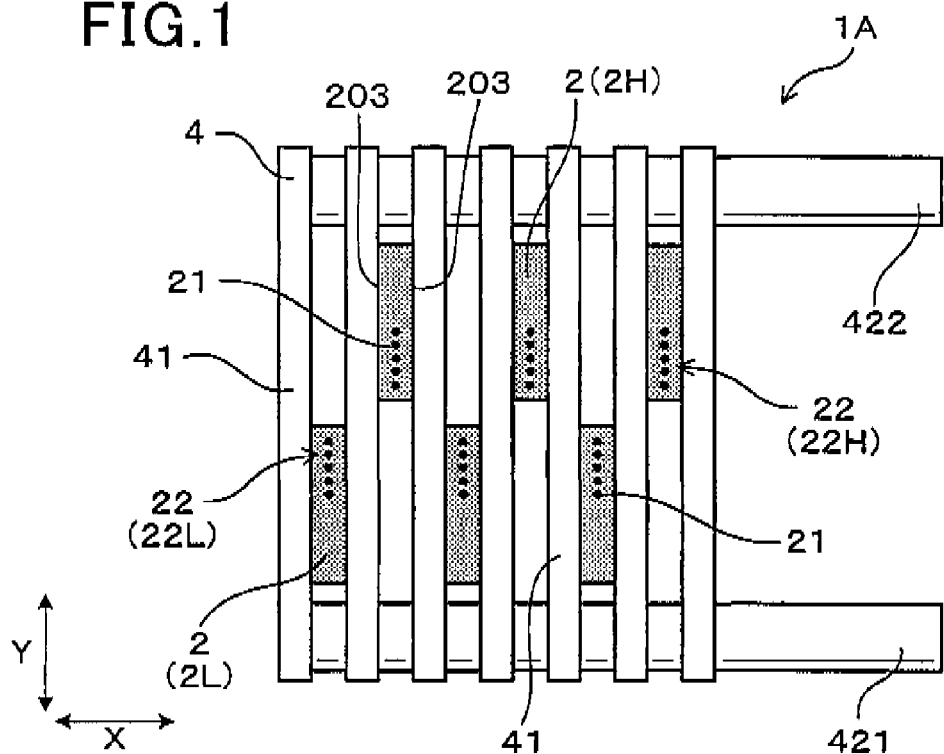
FIG. 1 is a plan view of a power conversion apparatus according to a first embodiment of the invention as viewed from the terminal projecting direction exclusive of its circuit board.

In the below-described embodiments, the same or equivalent components are indicated by the same reference numerals or letters.

First Embodiment

Figure 2:
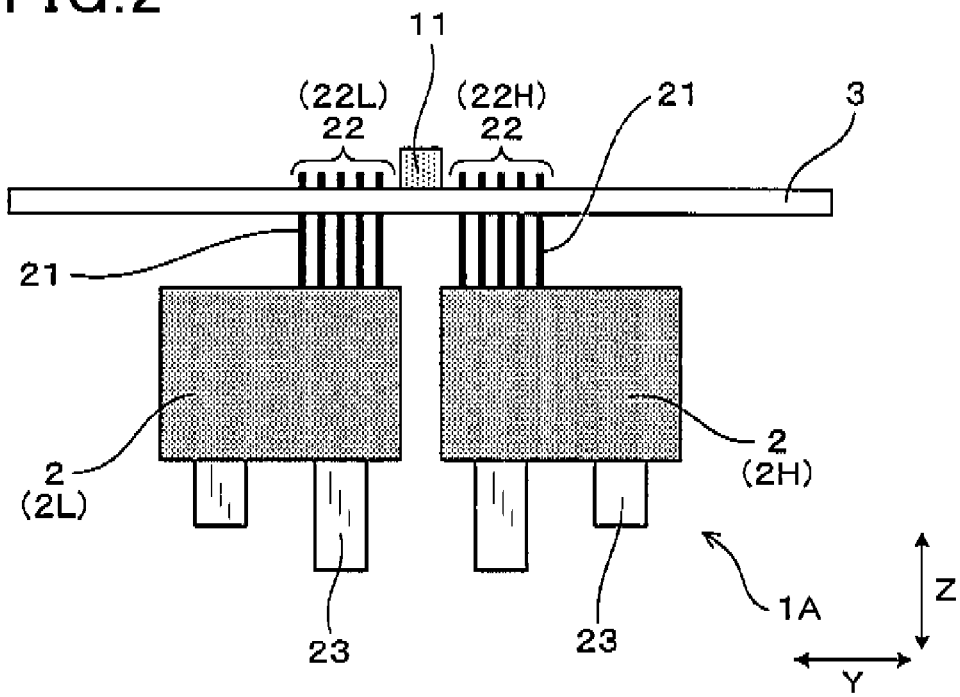
FIG. 2 is a front view of the power conversion apparatus according to the first embodiment of the invention as viewed from the orthogonal direction perpendicular to the terminal arranging direction exclusive of its cooler.
Figure 3:
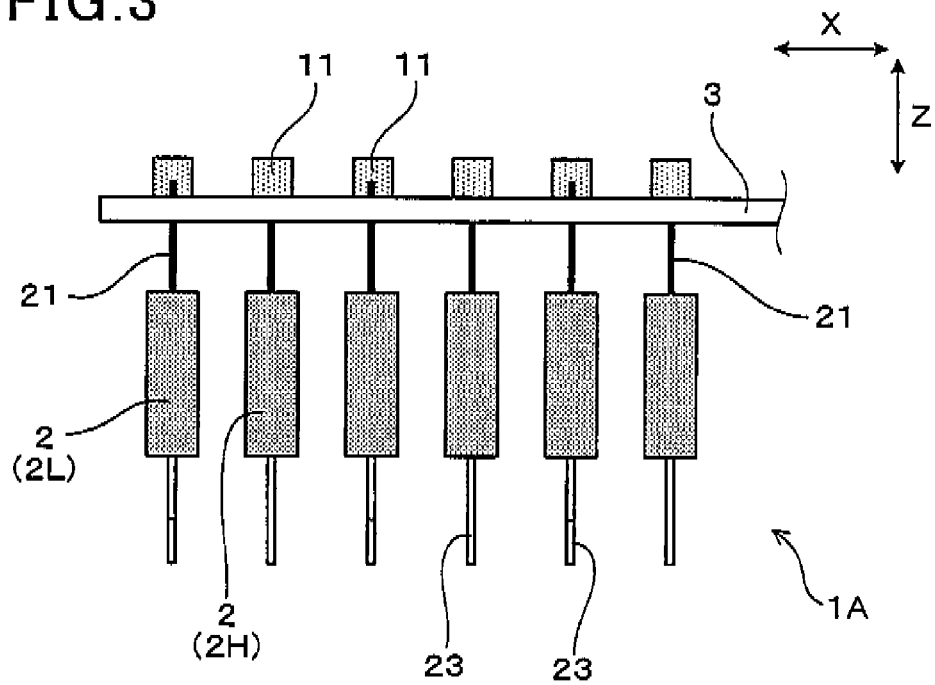
FIG. 3 is a side view of the power conversion apparatus according to the first embodiment of the invention as viewed from the terminal arranging direction exclusive of its cooler.

A power conversion apparatus 1A according to a first embodiment of the invention is described with reference to FIGS. 1 to 6. As shown in FIGS. 1 to 3, the power conversion apparatus 1A includes a plurality of semiconductor modules 2 each incorporating a switching element 201 and a circuit board 3 on which a control circuit for controlling the semiconductor modules 2 is formed.

Figure 5:
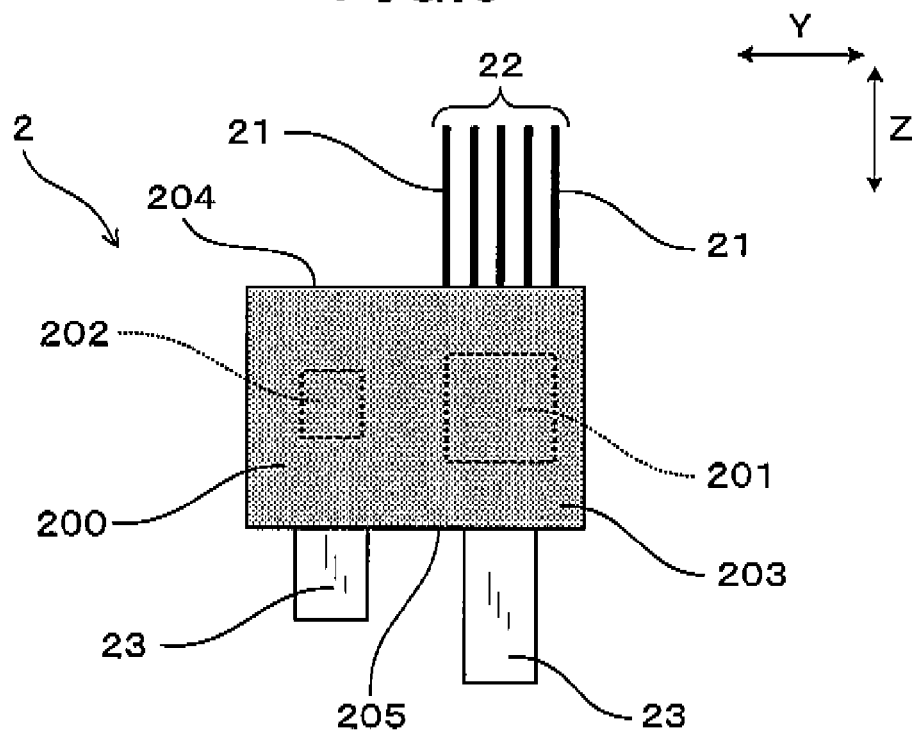
FIG. 5 is a front view of a semiconductor module included in the power conversion apparatus according to the first embodiment of the invention.
Figure 6:
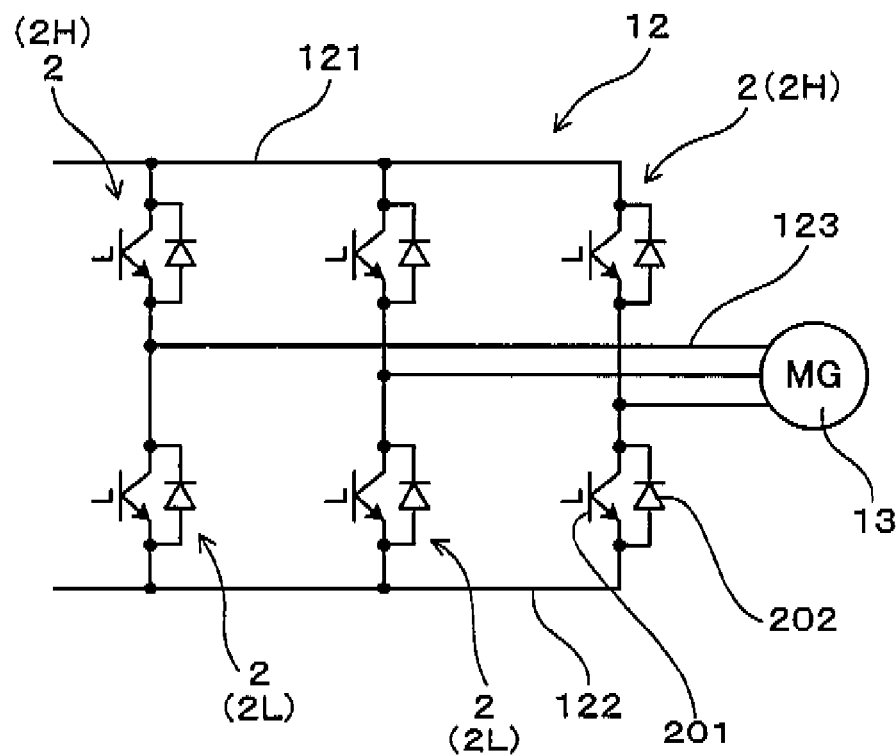
FIG. 6 is a diagram for explaining a power conversion circuit constituted of the semiconductor modules of the power conversion apparatus according to the first embodiment of the invention.

As shown in FIGS. 1 and 5, the semiconductor module 2 includes a plurality of signal terminals 21 connected to the circuit board 3. The signal terminals 21 are arranged in a line forming a terminal row 22 when viewed from the side of the circuit board 3. As shown in FIG. 6, the plurality of the semiconductor modules 2 are grouped into upper arm semiconductor modules 2H connected to the high potential side of a power conversion circuit constituted by the semiconductor modules 2 and lower arm semiconductor modules 2L series-connected to the upper arm semiconductor modules 2 and to the low potential side of the power conversion circuit.

Hereinafter, the rows formed by the signal terminals 22 of the upper arm semiconductor modules 2H are referred to as upper arm terminal rows 22H, and the rows formed by the signal terminals 22 of the lower arm semiconductor modules 2L are referred, to as lower arm terminal rows 22L. As shown in FIGS. 1 and 2, the terminal rows 22H and the terminal rows 22L are arranged in parallel to each other along the orthogonal direction X perpendicular to the direction in which the signal terminals 21 of the terminal rows 22 are arranged (referred to as the terminal arranging direction Y hereinafter) and the direction in which the signal terminals 21 project from the semiconductor modules 2 (referred to as the terminal projecting direction Z hereinafter).

As shown in FIGS. 1 and 2, the upper arm terminal rows 22H and the lower arm terminal rows 22L are disposed so as not to overlap with each other when viewed from the terminal arranging direction X. That is, the upper arm terminal rows 22H and the lower arm terminal rows 22L are disposed in a staggered manner when viewed from the terminal projecting direction Z.

The power conversion apparatus 1A is an inverter mounted on an electric vehicle or a hybrid vehicle. The semiconductor modules 2 constitutes the power conversion circuit (inverter circuit in this embodiment) 12 shown in FIG. 6. The inverter circuit 12 includes three pairs of the upper arm semiconductor module 2H and the lower arm semiconductor module 2L which are series-connected between a high potential line 121 and a low potential line 122. Each of these pairs may be referred to as "the series connection" hereinafter. Each semiconductor module 2 includes a switching element 201 such as an IGBT and a freewheel diode 202 inversely parallel-connected to the switching element 201.

Each of the series connections is connected, through an output line 123, to a corresponding one of three electrodes of a three-phase AC electric rotating machine 13 (a motor-generator in this embodiment) at its node between the upper arm semiconductor module 2H and the lower arm semiconductor module 2L constituting the series connection. More specifically, the node between the emitter of the upper arm semiconductor module 2H and the collector of the lower arm semiconductor module 2L of each series connection is connected to one of three wires which constitute the output line 123 and connected respectively to the U-phase, V-phase and W-phase electrodes of the three-phase AC electric rotating machine 13.

As shown in FIG. 5, the semiconductor module 2 includes a main body 200 incorporating the switching element 201, the freewheel diode 202 inversely parallel-collected to the switching element 201 and a plurality of (five in this embodiment) signal terminals 21 projecting from the main body 200. The main body 200 has a substantially rectangular shape. The opposite principal surfaces 203 having the largest area of the main body 200 serve as heat radiating surfaces. The five signal terminals 21 project in parallel from one end surface 204 of the main body 200. In this embodiment, three of the signal terminal 21 are connected to the gate, emitter and sense emitter of the switching element 201, respectively. The other two signal terminals 21 are connected to a pair of electrodes of a temperature sensor for detecting the element temperature.

The semiconductor module 2 includes two power terminals 23 projecting from the other end surface 205 of the main body 200. The power terminals 23 are connected respectively to the collector and emitter of the switching element 201 within the main body 200.

The position of each terminal row 22 formed by the five signal terminals 21 is biased from the center of the main body 200 with respect to the terminal arranging direction Y. That is, all of the signal terminals 21 are disposed biased to one of the opposite sides of the main body 200 along the orthogonal direction X. The upper arm semiconductor module 2H and the lower arm semiconductor module 2L have the same structure. As shown in FIGS. 1 and 2, the upper arm semiconductor module 2H and the lower arm semiconductor module 2L are disposed such that their orientations along the orthogonal direction X are opposite to each other. That is, the same two semiconductor modules 2 (the upper arm semiconductor module 2H and the lower arm semiconductor module 2L) are disposed such that the orientations of their principal surfaces 203 are opposite to each other, so that their terminal rows 22 become close to each other.

As shown in FIG. 1, the power conversion apparatus 1 includes a cooler 4 for cooling the semiconductor modules 2. The cooler includes a plurality of cooling tubes 41 coupled to one another at their both ends in their longitudinal direction. The cooling tubes 41 and the semiconductor modules 2 are stacked on one another alternately to form a stacked body. Each adjacent two of the cooling tubes 41 are respectively in contact with the opposite principal surfaces 203 of one of the semiconductor modules 2. The lamination direction of the stacked body is parallel to the orthogonal direction X, and the longitudinal direction of the cooling tubes 41 is parallel to the terminal arranging direction Y.

The cooler 4 further includes a coolant inlet tube 421 for introducing therein coolant and a coolant outlet tube 422 for discharging therefrom the coolant. Between each adjacent two of the cooling tubes 41, a respective one of the semiconductor modules 2 is disposed.

Figure 4:
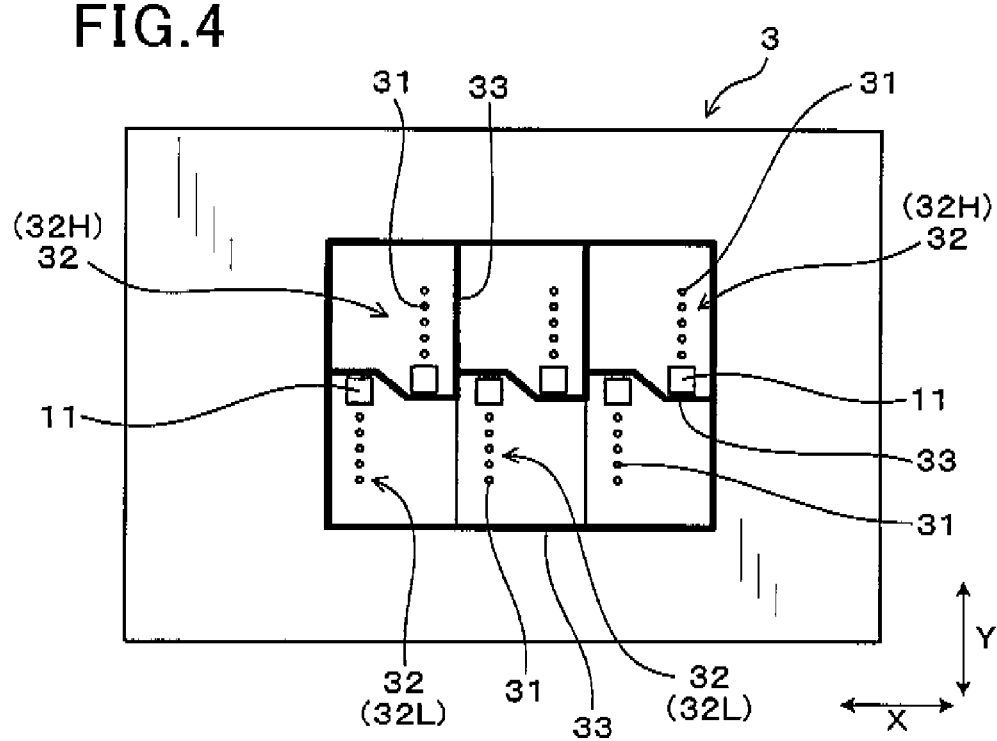
FIG. 4 is a plan view of the circuit board included in the power conversion apparatus according to the first embodiment at the invention.

As shown in FIGS. 2 and 3, the signal terminals 21 of the semiconductor modules 2 are connected to the circuit board 3. As shown in FIG. 4, the circuit board 3 is formed with through holes 31 for passing therethrough the signal terminals 21 to be connected to the circuit board 3. The through holes 31 are formed on one-to-one basis for the signal terminals 21 for each of the semiconductor modules 21. Accordingly, the through holes 31 for each semiconductor module 2 form a hole row 32 arranged in a straight line like the signal row 22 formed by the corresponding signal terminals 21. That is, the circuit board 3 is provided with the hole rows 32 corresponding to the terminal rows 22 on one-to-one basis. The hole rows 32 are grouped into upper arm hole rows 32H corresponding to the upper arm terminal rows 22H and lower arm hole rows 32L corresponding to the lower arm terminal rows 22L. The upper arm hole rows 32H and lower arm hole rows 32L are arranged parallel to each other along the orthogonal direction X in a staggered manner.

The signal terminals 21 of the semiconductor module 2 are inserted into the through holes 31 to be connected to the circuit board by soldering or the like. In the area between the upper arm terminal rows 22H and the lower arm terminal rows 22L on the circuit board 3, electric components 11 are mounted. That is, as shown in FIG. 4, the electric components 11 are mounted between the upper arm hole rows 32H and the lower arm hole rows 32L.

In this embodiment, the electronic component 11 is a MOSFET constituting an off-holding circuit for preventing the switching element 201 from being turned on due to noise. The electronic component 11 (may be referred to as the off-holding MOS 11 hereinafter) is provided for each of the semiconductor modules 2. The off-holding MOS 11 of one of the series-connected semiconductor modules 2 prevents that a collector-emitter surge voltage generated when the other semiconductor module 2 turns on is applied to the gate of this one semiconductor module 2, and this one semiconductor element is caused to turn on. In more detail, the off-holding MOS 11 forcibly keeps the gate voltage of the switching element 201 of the semiconductor module 2 which should be off equal to the emitter voltage to prevent malfunction of this semiconductor module 2. Accordingly, the off-holding MOS 11 (electronic component 11) should be disposed as close to the signal terminals 21 as possible.

The circuit board 3 is formed with an insulation boundary line 33 to provide electrical insulation between each adjacent hole row 32 and its adjacent hole row 32, and between each hole row 22 and internal wiring. The insulation boundary line 33 is formed so as to surround each of the hole rows 32. In each of the areas surrounded by the insulation boundary line 33, the electronic component (off-holding MOS) 11 is mounted in addition to the hole row 32.

The circuit board 3 is divided into a high-voltage area applied with a high voltage and a low-voltage area applied with a low voltage. The hole rows 32 are formed in the high-voltage area.

The first embodiment described above provides the following advantages. In the power conversion apparatus 1A, the upper arm terminal rows 22H and the lower arm terminal rows 22L are arranged in parallel to each other along the orthogonal direction X in a staggered manner. Accordingly, a sufficient creepage distance can be provided between the upper arm terminal rows 22H and the lower arm terminal rows 22L even when they are very close to each other in the terminal arranging direction. If the upper arm terminal row 22H and its counterpart lower arm terminal row 22L are located in the same position with respect to the orthogonal direction X, that is if the upper arm terminal row 22H and its counterpart lower arm terminal rows 22L are aligned in a straight line along the terminal arranging direction Y, the creepage distance between them becomes smaller as they are disposed closer to each other in the terminal arranging direction.

In this embodiment, since the upper arm terminal rows 22H and the lower arm terminal rows 22L are arranged in parallel to each other along the orthogonal direction X in a staggered manner, it is possible to provide a sufficient creepage distance between them even when they are disposed very close to each other in the terminal arranging direction Y. Accordingly, since the mounting space of the upper arm terminal rows 22H and the lower arm terminal rows 22L can be reduced in the terminal arranging direction Y, the dimension in the terminal arranging direction Y of the circuit board 3 can be reduced.

As a result, the space for mounting electronic components other than the semiconductor modules 2 on the circuit board 3 can be increased. More specifically, since the space for mounting the upper arm terminal rows 22H and the lower arm terminal rows 22L can be reduced in the terminal arranging direction Y, the space for mounting other electronic components can be extended on both lateral sides of the upper arm terminal rows 22H and the lower arm terminal rows 22L. Further, since the upper arm terminal rows 22H and the lower arm terminal rows 22L are arranged in a staggered manner along the orthogonal direction X, a space for mounting other electronic components can be provided between the upper arm terminal rows 22H and the lower arm terminal rows 22L an the circuit substrate 3. Also, by the arrangement of the upper arm terminal rows 22H and the lower arm terminal rows 22L described above, the flexibility of arrangement of electronic components on the circuit board 3 can be improved.

The arrangement that the upper arm terminal rows 22H and the lower arm terminal rows 22L are arranged in a staggered manner along the orthogonal direction X makes it possible to increase efficiency in making wiring between the upper arm semiconductor modules 2H and the lower arm semiconductor modules 2L which are series-connected to each other. In making wiring between the upper arm semiconductor modules 2H and the lower arm semiconductor modules 2L, the creepage distance between them has to be greatly taken into account. According to this embodiment, the creepage distance can be made sufficiently large because of the arrangement that the upper arm terminal rows 22H and the lower arm terminal rows 22L are arranged in a staggered manner along the orthogonal direction X.

The upper arm terminal rows 22H and the lower arm terminal rows 22L are located such that they do not overlap with each other when viewed from the orthogonal direction X. Also, this makes it easy to increase the creepage distance.

The upper arm semiconductor module 2H and the lower arm semiconductor module 2L have the same structure, and disposed such that their orientations along the Orthogonal direction X are opposite to each other. Accordingly, since the upper arm semiconductor module 2H and the lower arm semiconductor module 2L can be constituted of common parts, the manufacturing cost of the power conversion apparatus 1A can be reduced. Further, since the electronic components 11 are mounted in the area between the upper arm terminal rows 22H and the lower arm terminal rows 22L on the circuit board, the efficiency of usage of the space on the circuit board 3 can be increased.

Second Embodiment

Figure 7:
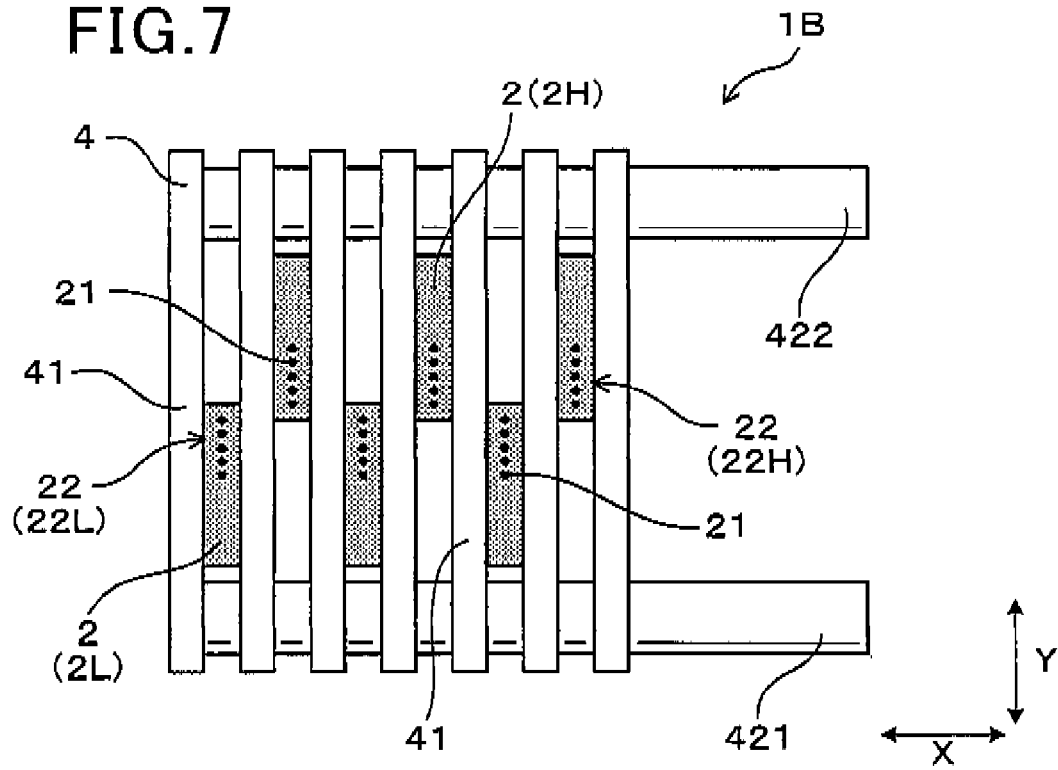
FIG. 7 is a plan view of a power conversion apparatus according to a second embodiment of the invention as viewed from the terminal projecting direction exclusive of its circuit board.
Figure 8:
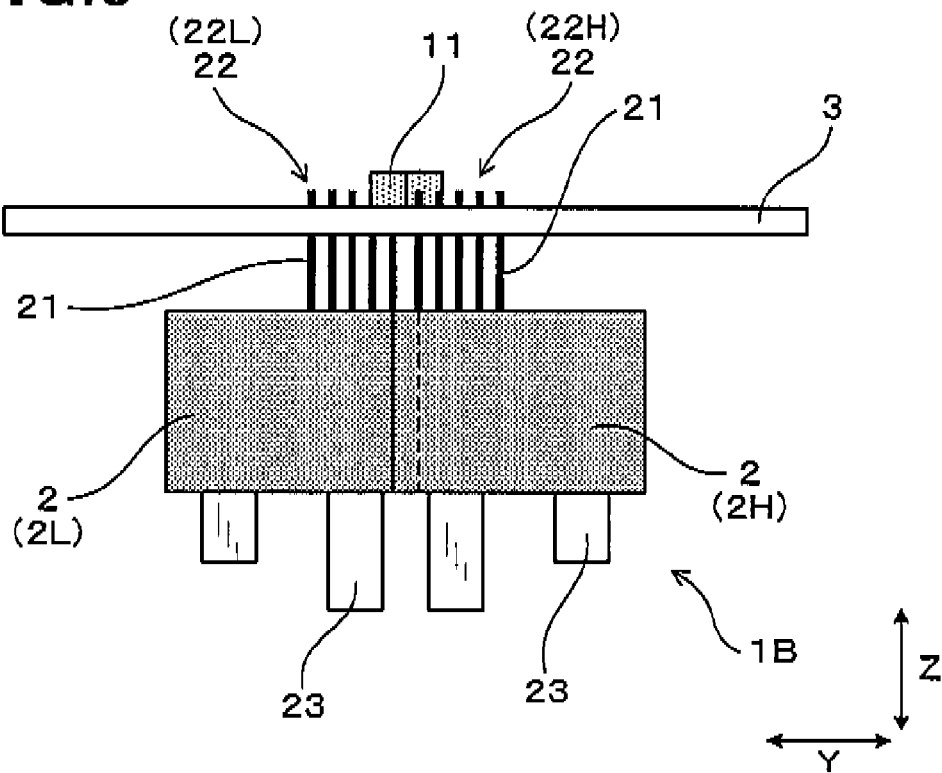
FIG. 8 is a front view of the power conversion apparatus according to the second embodiment of the invention as viewed from the orthogonal direction perpendicular to the terminal arranging direction exclusive of its cooler.
Figure 9:
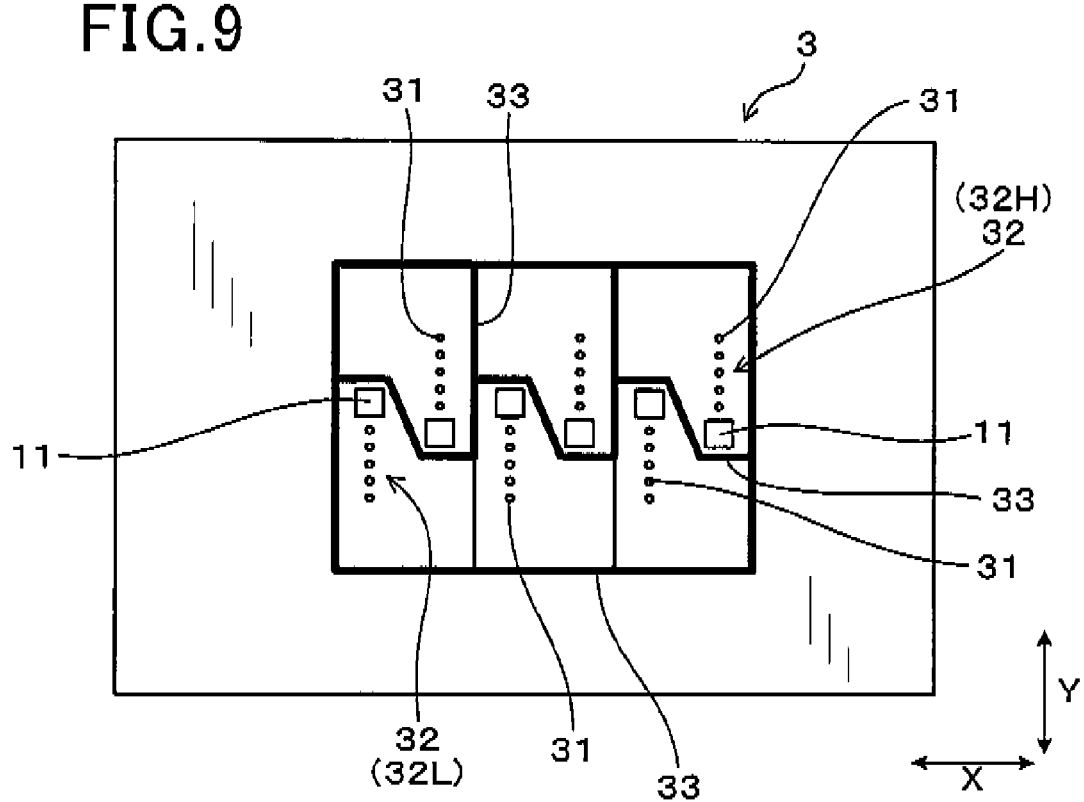
FIG. 9 is a plan view of a circuit board included in the power conversion apparatus according to the second embodiment of the invention.

Next, a power conversion apparatus 1B according to a second embodiment of the invention is described with reference to FIGS. 7 to 9. As shown in FIGS. 7 to 9, in the power conversion apparatus 1B according to the second embodiment, the upper arm semiconductor modules 2H and the lower arm semiconductor modules 2L partially overlap with each other when viewed from the orthogonal direction X unlike the power conversion apparatus 1A according to the first embodiment where they do not overlap with each other when viewed from the orthogonal direction X. However, in this embodiment, the upper arm terminal rows 22H and the lower arm terminal rows 22L do not overlap with each other when viewed from the orthogonal direction X.

Accordingly, as shown in FIG. 9, the upper arm hole rows 32H and the lower arm hole rows 32L can be made closer to each other in the terminal arranging direction Y. Except for the above, the second embodiment is the same in structure as the first embodiment.

According to the second embodiment, the space for mounting the semiconductor modules 2 can be further reduced in the terminal arranging direction Y. As a result, the dimension in the terminal arranging direction Y of the power conversion apparatus 1B according to the second embodiment can be further reduced. Also, the area in which the hole rows 32 are formed on the circuit board 3 can be reduced in the terminal arranging direction Y. Hence, according to the second embodiment, it is possible to reduce the dimension in the terminal arranging direction of the circuit board 3, and to provide a component-mounting space on both lateral sides of the hole rows 32 on the circuit board 3. In addition to the above described advantages, the second embodiment provides the same advantages provided by the first embodiment.

Third Embodiment

Figure 10:
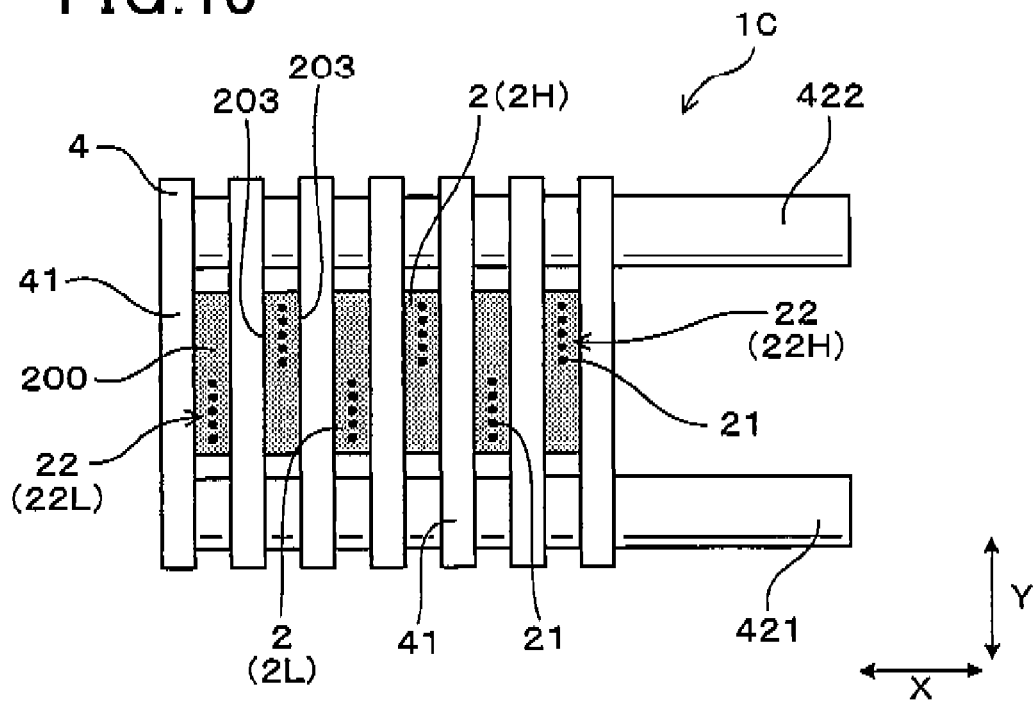
FIG. 10 is a front view of a power conversion apparatus according to a third embodiment of the invention as viewed from the orthogonal direction perpendicular to the terminal arranging
Figure 11:
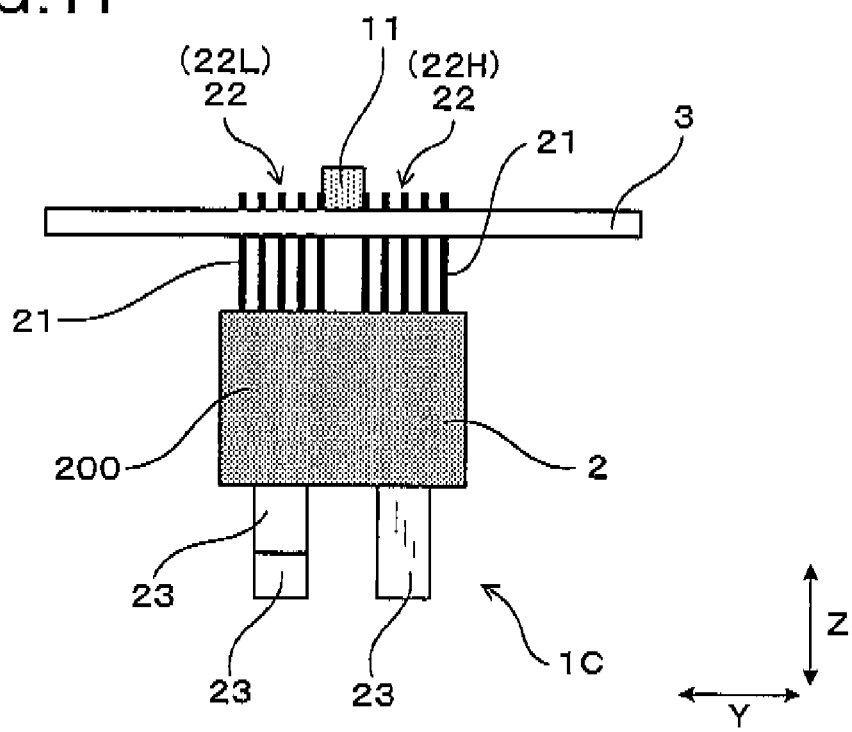
FIG. 11 is a plan view of a circuit board included in the power conversion apparatus according to the third embodiment of the invention.

Next, a power conversion apparatus 1C according to a third embodiment of the invention is described with reference to FIGS. 10 and 11. As shown in FIGS. 10 and 11, in the power conversion apparatus 1C according to the third embodiment, the upper arm semiconductor modules 2H and the lower arm semiconductor modules 2L are arranged alternately in a straight row along the orthogonal direction X. That is, they are arranged such that their main bodies 200 substantially completely overlap with one another when viewed from the orthogonal direction X.

Also in this embodiment, the upper arm semiconductor module 2H and the lower arm semiconductor module 2L have the same structure, and are arranged such that their orientations (directions of their principal surfaces 203) along the orthogonal direction are opposite to each other. Since the terminal rows 22 are located biased to one of the opposite sides of the main body 200 with respect to the terminal arranging direction Y, the upper arm terminal rows 22H and the lower arm terminal rows 22L do not overlap with each other when viewed from the orthogonal direction X. Except for the above, the third embodiment is the same in structure as the first embodiment.

According to the third embodiment described above, the space for mounting the semiconductor modules 2 can be further reduced in the terminal arranging direction Y, and accordingly, the dimension in the terminal arranging direction Y of the power conversion apparatus 1C can be further reduced. In addition to the above described advantages, the third embodiment provides the same advantages provided by the first embodiment.

Comparative Example 1

Figure 12:
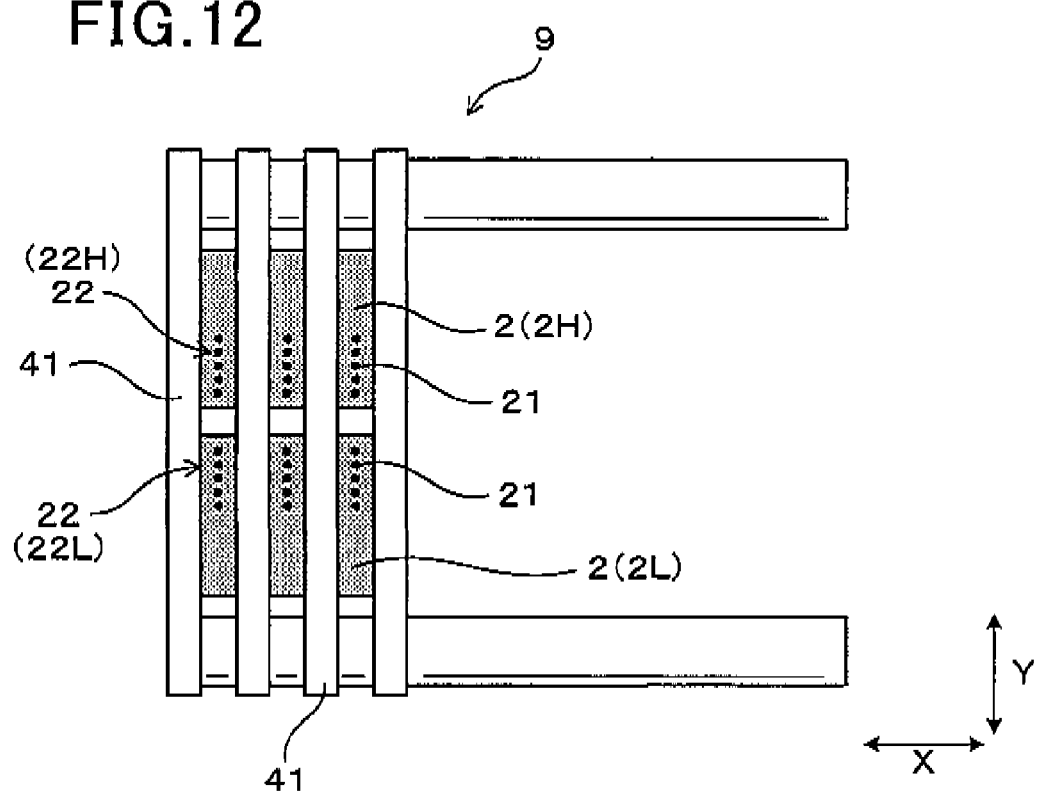
FIG. 12 is a plan view of a power conversion apparatus as a comparative example as viewed from the terminal projecting direction exclusive of its circuit board.

Next, a power conversion apparatus 9 as comparative example 1 is described with reference to FIG. 12. As shown in FIG. 12, in the power conversion apparatus 9, the upper arm terminal row 22H and its counterpart lower arm terminal row 22L are arranged in the same position with respect to the orthogonal direction X. That is, the signal terminals 21 of the upper arm terminal row 22H and the signal terminals 21 of its counterpart lower arm terminal row 22L are aligned in a straight line along the terminal arranging direction Y.

Further, each pair of the upper arm semiconductor module 2H and the lower arm semiconductor module 2L is disposed between each adjacent two of the cooling tubes 41. Except for the above, the comparative example 1 is the same in structure as the first embodiment.

In this example, the creepage distance between the upper arm terminal row 22H and the lower arm terminal row 22L becomes smaller as they are disposed closer to each other in the terminal arranging direction Y. Accordingly, there is a constraint in reducing the distance between the upper arm terminal row 22H and the lower arm terminal row 22L in the terminal arranging direction Y.

If the distance between the upper arm terminal row 22H and the lower arm terminal row 22L in the terminal arranging direction Y is increased sufficiently, since the dimension in the terminal arranging direction Y of the circuit board 3 is increased substantially, it becomes difficult to make the power conversion apparatus 9 compact in size. Also, to sufficiently increase the distance between the upper arm semiconductor modules 2H and the lower arm semiconductor modules 2L in the terminal arranging direction Y, the dimension in the terminal arranging direction Y of the power conversion apparatus 9 has to be increased.

Comparative Example 2

Figure 13:
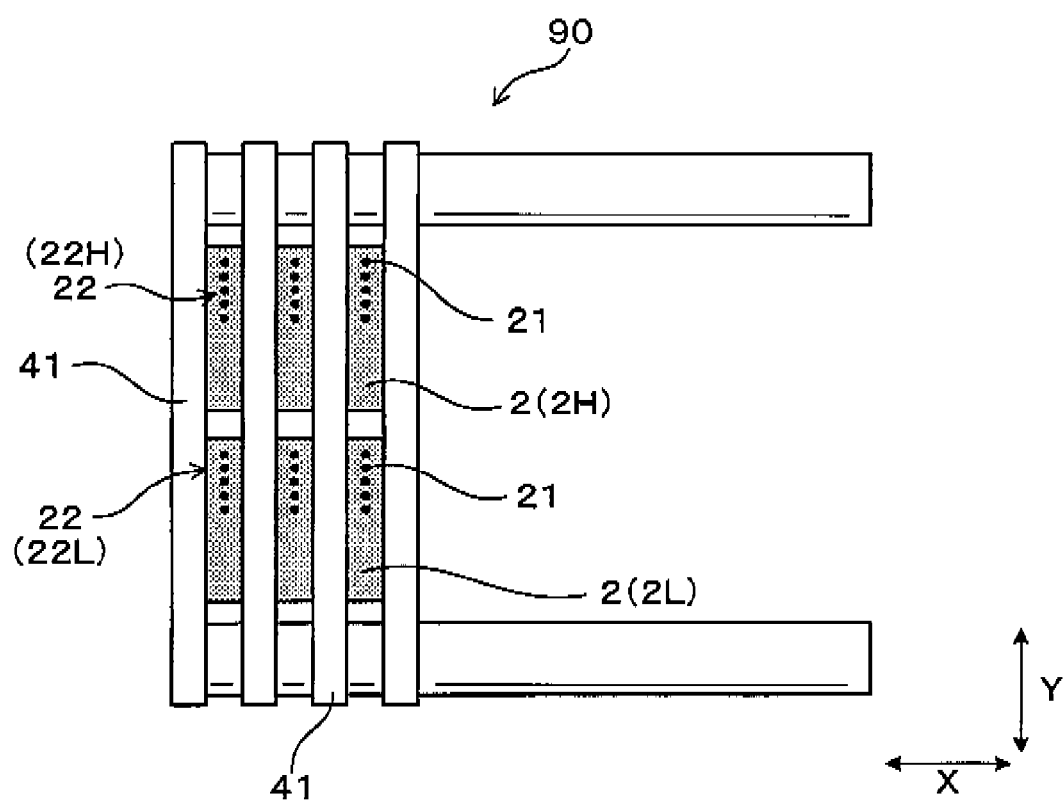
FIG. 13 is a plan view of a power conversion apparatus as another comparative example as viewed from the terminal projecting direction exclusive of its circuit board.

Next, a power conversion apparatus 90 as comparative example 2 is described with reference to FIG. 13. As shown in FIG. 13, in the power conversion apparatus 90, the upper arm terminal row 22H and its counterpart lower arm terminal row 22L are arranged in the same position with respect to the orthogonal direction X like in the comparative example 1, however, the orientations along the terminal arranging direction Y of the upper arm terminal row 22H and the lower arm terminal row 22L are the same with each other. Except for the above, comparative example 2 is the same in structure as comparative example 1.

In this example, it is easy to provide a long creepage distance between the upper arm terminal rows 22H and the lower arm terminal rows 22L. However, since the area in which the upper arm terminal rows 22H and the lower arm terminal rows 22L are formed extends in the terminal arranging direction Y, the hole rows are spread out in the terminal arranging direction Y. That is, since the area in which the hole rows are formed extends in the terminal row arranging direction Y, the space for forming other electronic components on the circuit board is restricted.

The above explained preferred embodiments are exemplary of the invention of the present application which is described solely by the claims appended below. It should be understood that modifications of the preferred embodiments may be made as would occur to one of skill in the art.

What is claimed is:

1. A power conversion apparatus comprising:
semiconductor modules constituting a power conversion circuit, each of the semiconductor modules incorporating a switching element; and
a circuit board on which a control circuit for controlling switching of the switching elements of the semiconductor modules is formed,
wherein
each of the semiconductor modules includes signal terminals electrically connected to the circuit board,
the signal terminals of each of the semiconductor modules are arranged in a line so as to form a terminal row along a first direction,
the semiconductor modules are grouped into upper arm semiconductor modules each connected to a high potential side of the power conversion circuit and lower arm semiconductor modules each connected to a low potential side of the power conversion circuit and to a corresponding one of the upper arm semiconductor modules, and
upper arm terminal rows as the terminal rows of the upper arm semiconductor modules and lower arm terminal rows as the terminal rows of the lower arm semiconductor modules are arranged in a staggered manner along a second direction perpendicular to the first direction and to a third direction in which the signal terminals of the semiconductor modules project, the first, second and third directions being perpendicular to one another.

2. The power conversion apparatus according to claim 1, wherein the upper arm terminal rows and the lower arm terminal rows are disposed alternately along the second direction.

3. The power conversion apparatus according to claim 1, wherein the upper arm terminal rows and the lower arm terminal rows are disposed so as to not overlap with each other when viewed from the second direction.

4. The power conversion apparatus according to claim 1, wherein the upper arm semiconductor modules and the lower arm semiconductor modules are disposed so as to overlap at least partially with each other when viewed from the second direction.

5. The power conversion apparatus according to claim 4, wherein the upper arm semiconductor modules and the lower arm semiconductor modules are disposed alternately in a line along the second direction.

6. The power conversion apparatus according to claim 1, wherein the upper arm semiconductor modules and the lower arm semiconductor modules have a same structure, and are disposed such that orientation in the second direction of the upper arm semiconductor modules and orientation in the second direction of the lower arm semiconductor modules are opposite to each other.

7. The power conversion apparatus according to claim 1, wherein electronic components of the power conversion circuit are mounted in an area between the upper arm terminal rows and the lower arm terminal rows on the circuit board.

* * * * *